United States Patent
Wenzel et al.

(10) Patent No.: US 7,528,069 B2
(45) Date of Patent: May 5, 2009

(54) FINE PITCH INTERCONNECT AND METHOD OF MAKING

(75) Inventors: Robert J. Wenzel, Austin, TX (US); George R. Leal, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 168 days.

(21) Appl. No.: 11/267,975

(22) Filed: Nov. 7, 2005

(65) Prior Publication Data

US 2007/0102828 A1 May 10, 2007

(51) Int. Cl.
*H01L 21/44* (2006.01)

(52) U.S. Cl. .............................. 438/669; 257/E23.019; 438/612

(58) Field of Classification Search .......... 257/E23.019, 257/E21.586–21.587; 438/625, 629, 640, 438/687, 666, 669, 628, 644, 652, 654, 612
See application file for complete search history.

(56) References Cited

U.S. PATENT DOCUMENTS

| | | | |
|---|---|---|---|
| 4,714,516 A | | 12/1987 | Eichelberger et al. |
| 5,019,997 A | * | 5/1991 | Haller .......................... 716/21 |
| 6,506,632 B1 | | 1/2003 | Cheng et al. |
| 6,518,092 B2 | * | 2/2003 | Kikuchi ....................... 438/107 |
| 6,753,253 B1 | * | 6/2004 | Takahashi et al. ........... 438/676 |
| 6,753,609 B2 | * | 6/2004 | Chien et al. ................. 257/761 |
| 6,812,573 B2 | * | 11/2004 | Shimoishizaka et al. ......... 257/E23.019 |
| 6,891,273 B2 | | 5/2005 | Pu et al. |
| 2003/0207561 A1 | * | 11/2003 | Dubin et al. ................. 438/630 |
| 2005/0079705 A1 | | 4/2005 | Takeuchi |
| 2005/0142874 A1 | | 6/2005 | Keum |
| 2005/0146034 A1 | | 7/2005 | Andreyushchenko et al. |
| 2005/0205978 A1 | | 9/2005 | Pu et al. |

FOREIGN PATENT DOCUMENTS

DE 10258081 A1 * 7/2004
WO WO 02/01928 A1 1/2002

OTHER PUBLICATIONS

Alam, Syed M. et al., "Circuit-Level Reliability Requirements for Cu Metallization"; Sep. 2005; pp. 522-531; vol. 5, No. 3; IEEE Transactions on Device and Materials Reliability; IEEE.
International Search Report and written opinion (8 pages).

* cited by examiner

*Primary Examiner*—David A Zarneke
*Assistant Examiner*—Jenny L Wagner
(74) *Attorney, Agent, or Firm*—Robert L. King; James L. Clingan, Jr.

(57) ABSTRACT

Fine pitch contacts are achieved by using traces that extend to the contacts without requiring capture pads at the contact pads. Capture pads are desirably avoided because they have a diameter greater than the line to which they are attached. Preferably, adjacent contact pads are present in the same opening in the dielectric. The traces to the contact pads are in a line so that no widening is required where the lines make contact to the contact pads. The lines can be widened before they get to the contact pads but at the contact pads, they are substantially at the minimum width for the line. Thus, the contact pads can be at a pitch much lower than if capture pads were used.

18 Claims, 9 Drawing Sheets

FINE PITCH INTERCONNECT AND METHOD OF MAKING

FIELD OF THE INVENTION

This disclosure relates to semiconductors, and more particularly to semiconductor interconnection technology for electrical connections.

RELATED ART

An integrated circuit contains multiple pads. Some applications of the integrated circuit involve the placement of a thin film, such as a dielectric layer, over the integrated circuit. When the thin film is present, the multiple pads of the integrated circuit require an interconnect thereto at a location within an overlying level. These pads are often arranged in as close proximity to each other as possible. These interconnects are commonly referred to as vias. A via is formed from a hole in a dielectric layer that is filled or plated with an electrical conductor so that contact is made from a lower level pad known as a land to a higher level pad known as a via capture pad. Therefore, the land and the capture pad have aligned centers. Manufacturing design rules require that the capture pad have at least a predetermined larger size than the opening of the via. The larger size requires the capture pad to extend beyond the opening of the via in all directions. The size of the capture pad is therefore significantly larger than the size of the dielectric opening. Additionally, a minimum distance is required between the overlying capture pads which further increases the minimum pitch between the capture pads and as a result between the lands.

Figure 1:
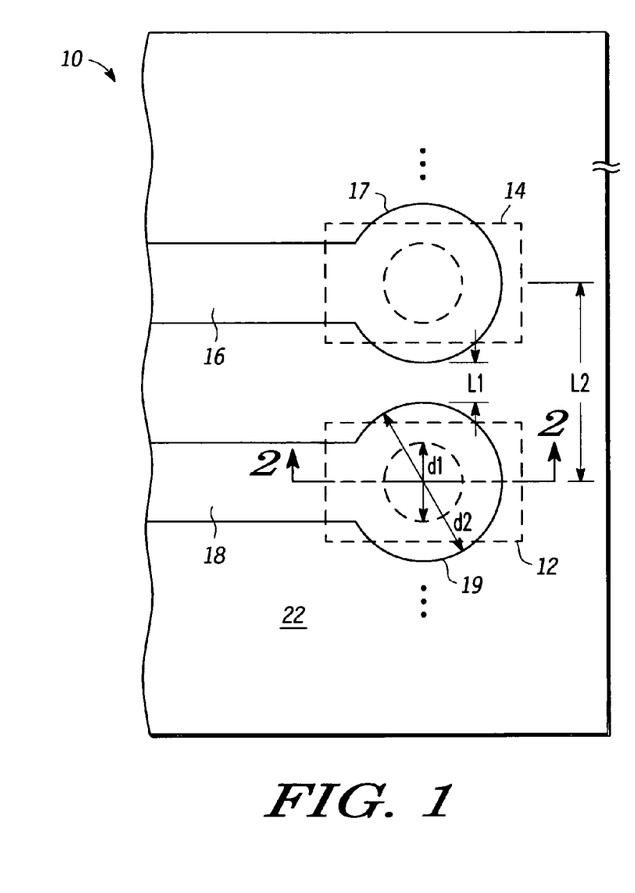
FIG. 1 illustrates in topographical form a known integrated circuit with limited pad pitch.

For example in FIG. 1 there is shown a known integrated circuit 10 with interconnects. A pad 12 is located adjacent another pad 14. In one form each of pad 12 and pad 14 may be implemented as a land. Overlying the pad 12 and pad 14 is a dielectric layer 22. Overlying the dielectric layer 22 is a conductive trace or metal interconnect 16 and a metal interconnect 18 which function as traces. The metal interconnect 16 is connected to a capture pad 17 which is further connected to pad 14 by a hole or via having a diameter d1. Similarly, the interconnect 18 is connected to land 12 by way of a hole or via having a diameter dl that is captured by a via capture pad 19 having a diameter d2 which is substantially larger than diameter d1.

The capture pad 17 is separated from capture pad 19 by a required minimum length labeled L1. As a result, the distance between the center of the capture pad 17 and capture pad 19 is L2. A disadvantage is that L2 limits the total number of pads along the side of integrated circuit 10. In other words, in the prior art the distance L2 is the limiting factor that prevents integrated circuit from having a smaller land pad pitch.

Figure 2:
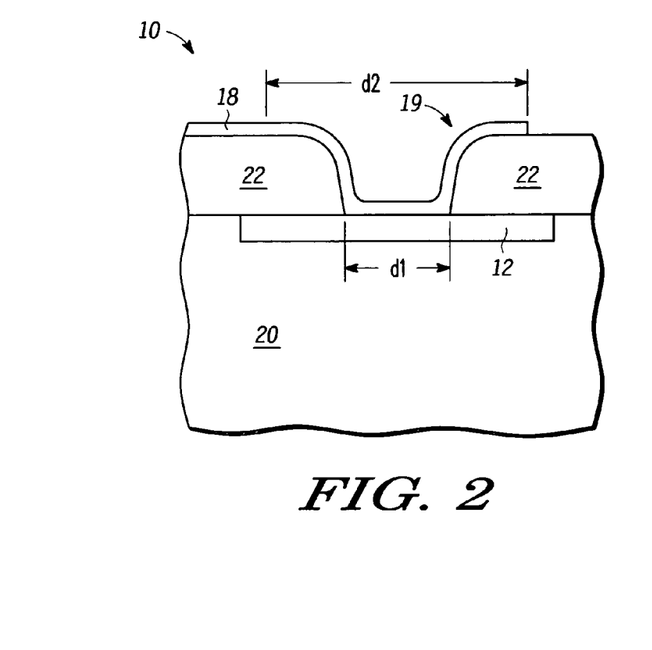
FIG. 2 illustrates in cross-sectional form a pad of the integrated circuit of FIG. 1 with overlying interconnect.

Illustrated in FIG. 2 is a cross-section of capture pad 19, die pad 12 and associated via taken along line 2-2 of FIG. 1. The pad 12 is situated within a substrate 20 of integrated circuit 10. It should be understood that substrate 20 may be implemented at various levels within integrated circuit 10 other than at a bulk or body layer. A dielectric layer 22 overlies the substrate 20 and has an opening of width d1 to define the via. Overlying the dielectric layer 22 is the metal interconnect 18 which intersects via capture pad 19 and electrically connects to pad 12.

BRIEF DESCRIPTION OF THE DRAWINGS

The present invention is illustrated by way of example and not by limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 3:
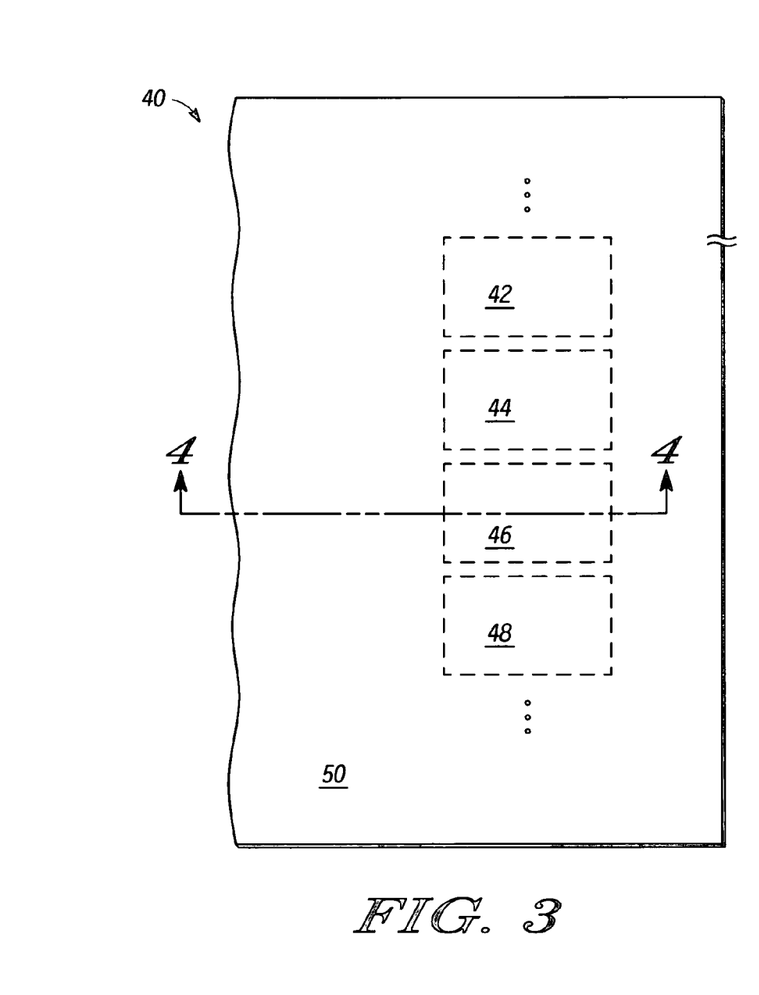
FIGS. 3-18 illustrate in either topographical or cross-sectional form an integrated circuit having a fine pitch interconnect in accordance with the present invention.

Illustrated in FIG. 3 is an integrated circuit 40 with interconnect in accordance with the present invention. In the illustrated form there is provided a plurality of die pads, such as a die pad 42, a die pad 44, a die pad 46 and a die pad 48. It should be understood that the term die pad is one form of a contact pad. The structures described herein may be readily implemented in a semiconductor or electronic device on a surface other than a die. For example, the structures described herein may be implemented on a layer overlying multiple layers overlying a die or may be implemented on a printed circuit board. Each of die pads 42, 44, 46 and 48 is positioned lateral to each other and as close to one another as physically possible to reliably manufacture the integrated circuit 10. In one form the die pads 42, 44, 46 and 48 have a pitch or separation distance that is one hundred micrometers (microns) or less. In the illustrated form the die pads 42, 44, 46 and 48 are positioned adjacent an edge of the integrated circuit 40. However, it should be well understood that other locations within the integrated circuit 40 for the placement of die pads 42, 44, 46 and 48 may be selected. Overlying the integrated circuit 40 and a portion of die pads 42, 44, 46 and 48 is a dielectric layer 50. In the illustrated form the die pads 42, 44, 46 and 48 have two edges aligned two lines parallel to an adjacent periphery of the integrated circuitry. In the illustrated form the die pads 42, 44, 46 and 48 are substantially rectangular. It should be understood that other geometric forms for the contact pads may be implemented including circles, squares, octagons or other polygons.

Figure 4:
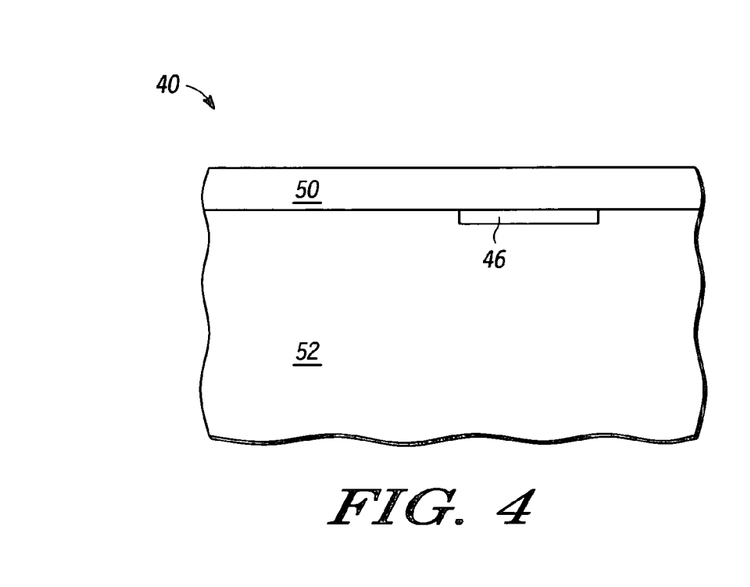

Illustrated in FIG. 4 is a cross-sectional view of die pad 46 taken along line 4-4. The die pad 46 is formed within a substrate 52 of the integrated circuit 40. Overlying the die pad 46 is dielectric layer 50. The dielectric layer 50 may be made from any of a number of insulating materials such as oxides, nitrides, Bismaleimide-Triazine (BT) from Mitsubishi Gas and Chemical, Bisbenzocyclobutene (BCB) from Dow Chemical, Intervia 8010 by Rohm and Haas, or polymer based dry film dielectrics. The selected material may or may not be photodefinable and may be applied by a variety of techniques such as lamination or spin coating.

Figure 5:
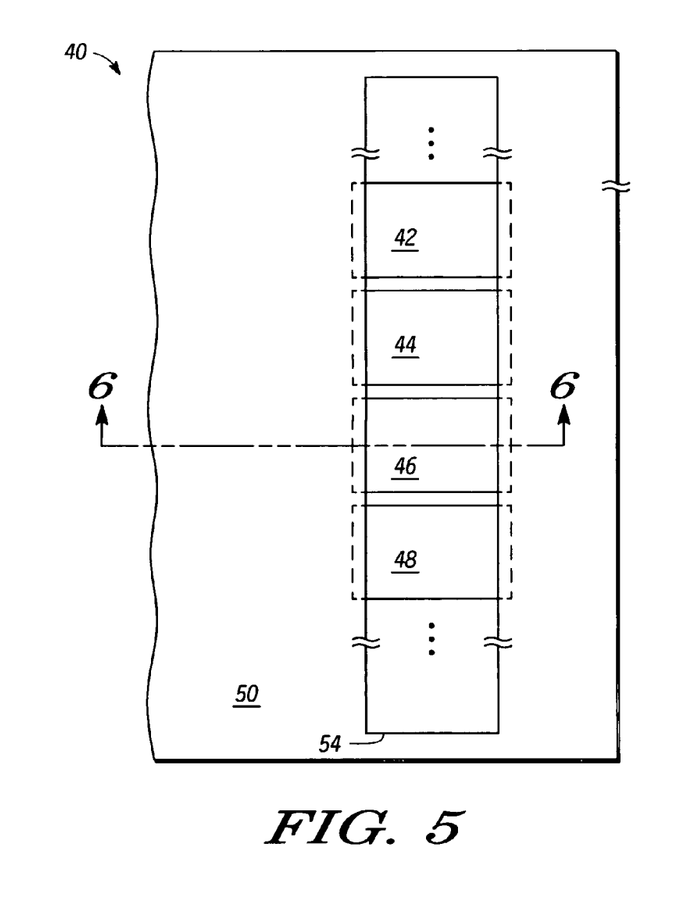

Illustrated in FIG. 5 is further processing of integrated circuit 40. A trench or opening 54 is formed in the dielectric layer 50. The opening 54 has a length along a periphery of the integrated circuit and a width that is within the two lines that the die pads 42, 44, 46 and 48 are aligned along. The trench or opening 54 may be formed, for example, by photodefinition or laser ablation.

Figure 6:
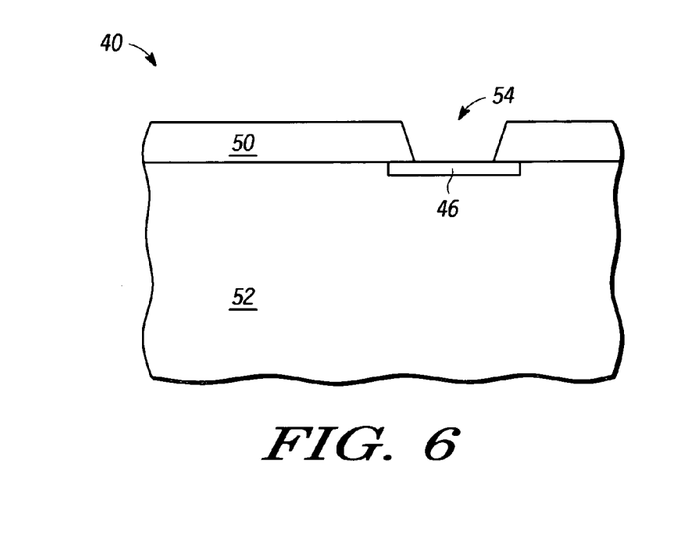

Illustrated in FIG. 6 is a cross-section of the integrated circuit 40 taken substantially along line 6-6 of FIG. 5. In the illustrated form the opening 54 is located overlying only a portion of the width of die pad 46. While the walls of the opening 54 are illustrated as being slanted, it should be understood that the walls of opening 54 may be formed so that they are substantially vertical.

Figure 7:
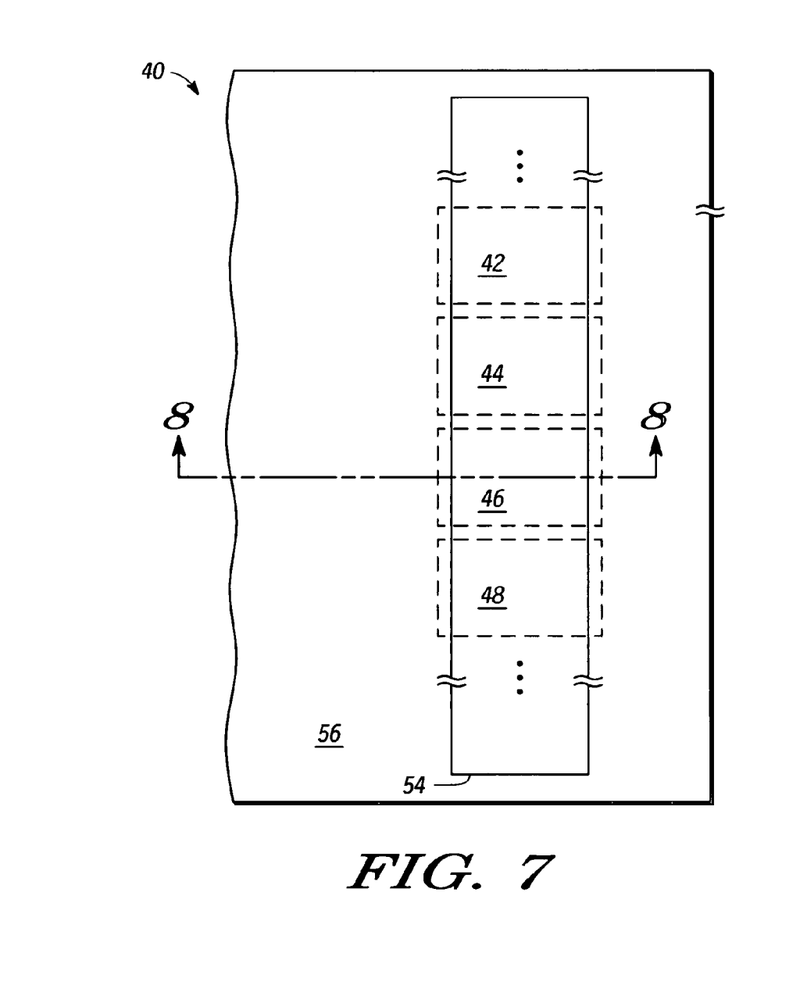

Illustrated in FIG. 7 is further processing of the integrated circuit 40. A seed layer 56 (so termed for being a layer from which another layer is formed) is formed overlying the dielectric layer 50 and the die pads 42, 44, 46 and 48 after forming the opening 54. The seed layer 56 may alternatively be referred to as a bus layer for plating. The seed layer 56 is formed in one embodiment by depositing one of titanium, tungsten, copper, titanium copper, titanium tungsten copper or other metal or metal combination suitable as a seed layer. In another form the seed layer 56 may be formed by electroless plating of copper.

Figure 8:
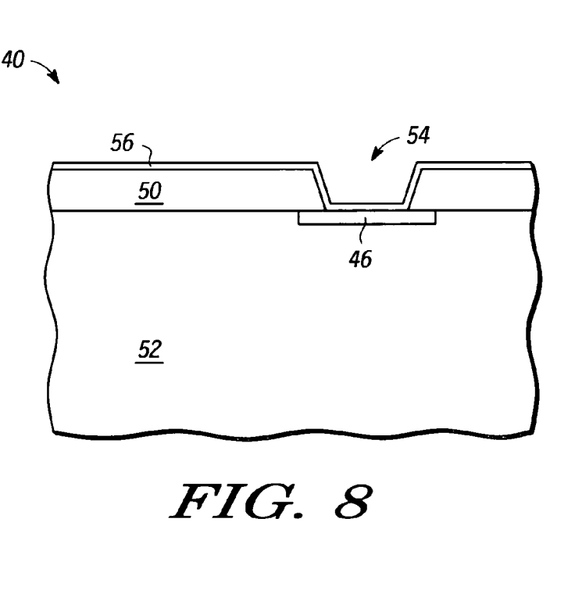

Illustrated in FIG. 8 is a cross-section of the integrated circuit 40 taken substantially along line 8-8 of FIG. 7. In the illustrated form the seed layer 56 is a thin film relative to the thickness of dielectric layer 50. The seed layer 56 is blanket deposited and thus is formed in the opening 54 as well as over the dielectric layer 50.

Figure 9:
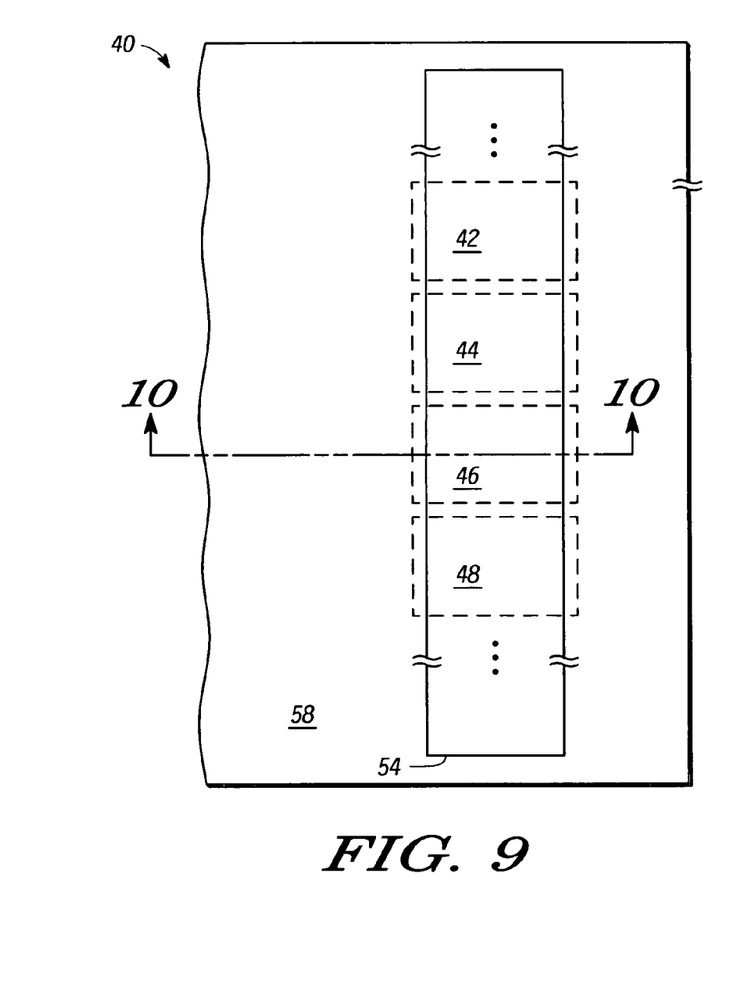

Illustrated in FIG. 9 is further processing of the integrated circuit 40. A film of photoresist 58 is formed overlying the integrated circuit 40 and directly onto the seed layer 56. In one embodiment the photoresist 58 is formed by a spin operation or spray coating. In other forms a laminar film of photoresist 58 may be formed.

Figure 10:
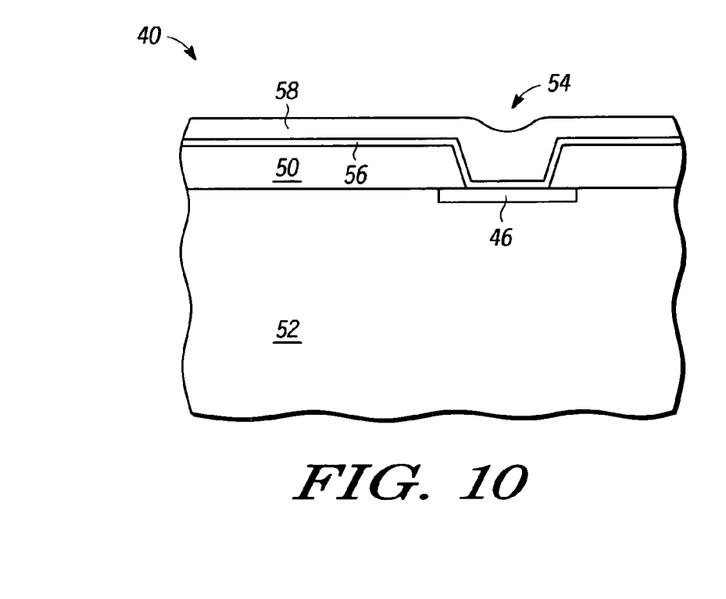

Illustrated in FIG. 10 is a cross-section of the integrated circuit 40 taken substantially along line 10-10 of FIG. 9. The film of photoresist 58 is illustrated as substantially filling the opening 54. A small dip or recessed area in the photoresist 58 may be present directly over the opening 54.

Figure 11:
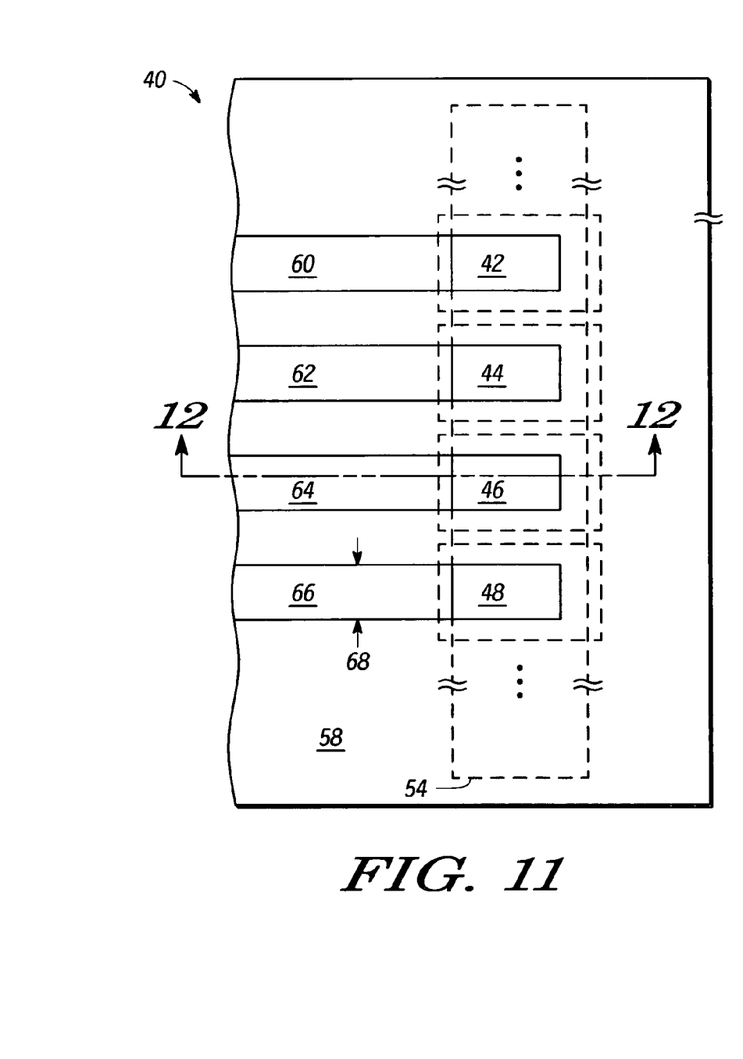

Illustrated in FIG. 11 is further processing of the integrated circuit 40 in which a plurality of trace openings 60, 62, 64 and 66 is formed by patterning the photoresist 58. The patterning of photoresist 58 creates substantially uniform sized trace openings 60, 62, 64 and 66 which respectively expose die pads 42, 44, 46 and 48. The patterning forms trace openings 60, 62, 64 and 66 each with a trace opening width 68. In order to minimize the pitch, defined as the space between two adjacent traces, a minimum width for each of the trace openings 60, 62, 64 and 66 occurs in one form over the die pads. While each of the openings 60, 62, 64 and 66 is illustrated with substantially the same dimensions, it should be understood that the photoresist 58 may be patterned with a predetermined pattern such that the dimensions of the openings 60, 62, 64 and 66 vary. Openings 60, 62, 64 and 66 are illustrated as ending on the right at a point within the trench formed by opening 54. However, openings 60, 62, 64 and 66 may extend beyond the opening 54 to the right if desired.

Figure 12:
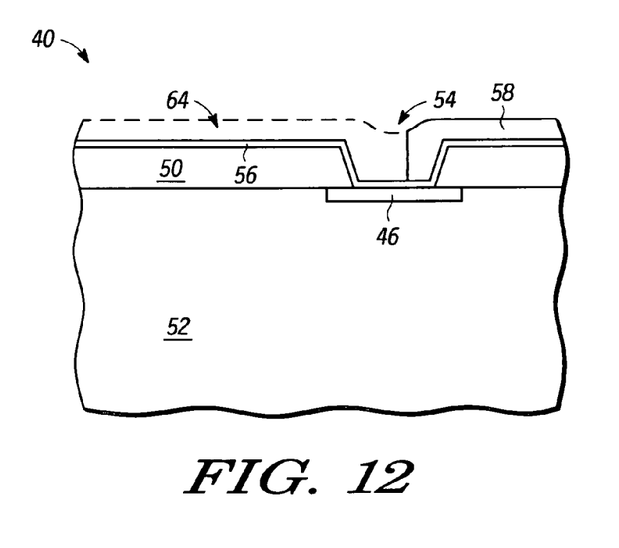

Illustrated in FIG. 12 is a cross-sectional view of integrated circuit 40 taken along line 12-12 of FIG. 11. In the illustrated form the opening 64 extends from the left of the view to a point within the opening 54. In an alternate form opening 64 may also extend beyond the opening 54 to the right so that an opening is present above dielectric layer 50 and seed layer 56 on the right-most portion of FIG. 12 if so desired. However, as illustrated in FIG. 12, a portion of the photoresist 58 on the right is left intact overlying the seed layer 56 to continue masking the seed layer 56.

Figure 13:
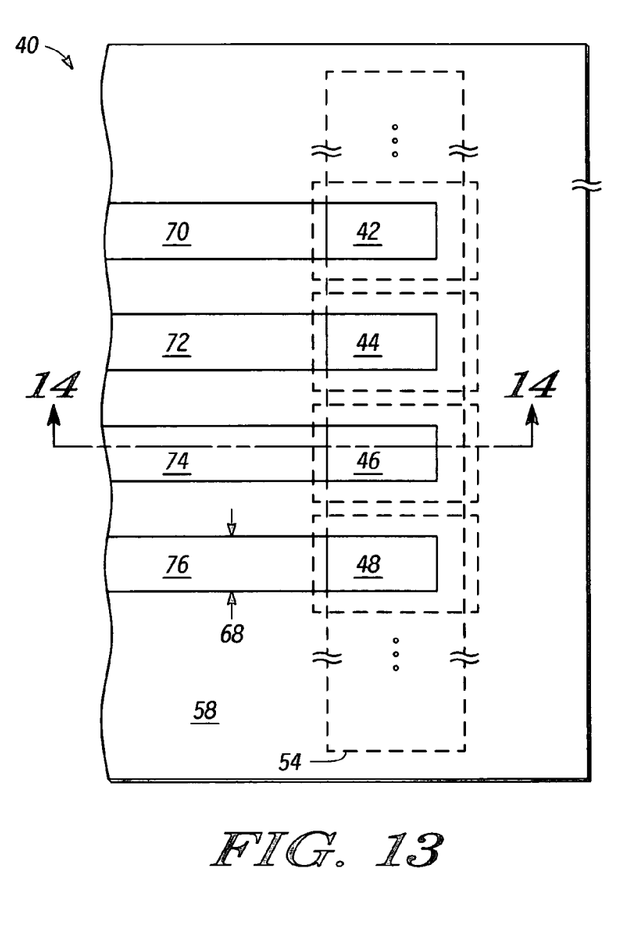

Illustrated in FIG. 13 is further processing of the integrated circuit 40 in which conductive material is formed in each of the openings 60, 62, 64 and 66 to form conductive lines such as metal traces 70, 72, 74 and 76. The metal traces 70, 72, 74 and 76 are respectively in direct contact with die pads 42, 44, 46 and 48 yet remains electrically short-circuited together by the seed layer 56 between the metal traces 70, 72, 74 and 76. The metal in one form is copper but it should be well understood that other metals and other conductive materials may be formed. In the process as illustrated, the metal is formed by electroplating using the seed layer 56 to plate the metal in the openings 60, 62, 64 and 66. It should be understood that other metallization processes, such as electroless plating, may be used.

Figure 14:
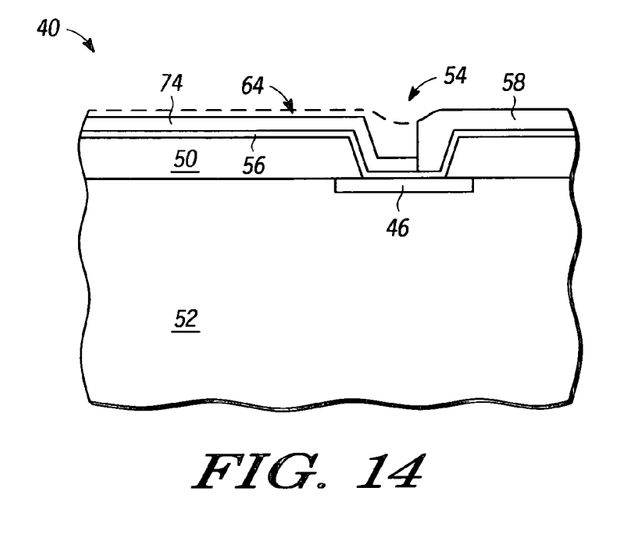

Illustrated in FIG. 14 is a cross-sectional view taken along line 14-14 of FIG. 13. The metal trace 74 overlies a portion of seed layer 56 and extends into opening 54 to make contact with die pad 46. It should be noted that the thickness of metal trace 74 is substantially uniform along the length. Because seed layer 56 and metal trace 74 are both conductive, an electrical connection to die pad 46 is formed. Note that as in FIG. 13 the seed layer 56 continues to electrically short circuit the metal traces 70, 72, 74 and 76. The metal trace 74 is illustrated extending to the left in FIG. 14 and may be further patterned to connect to other circuitry (not shown) on the same level or to other levels (not shown) of integrated circuit 40. In another form metal trace 74 may extend to the right of the opening 54 to lie on top of the dielectric layer 50 on the right side of FIG. 14. In such an alternate form the photoresist 58 is removed on the right side to permit the formation of metal on the seed layer 56.

Figure 15:
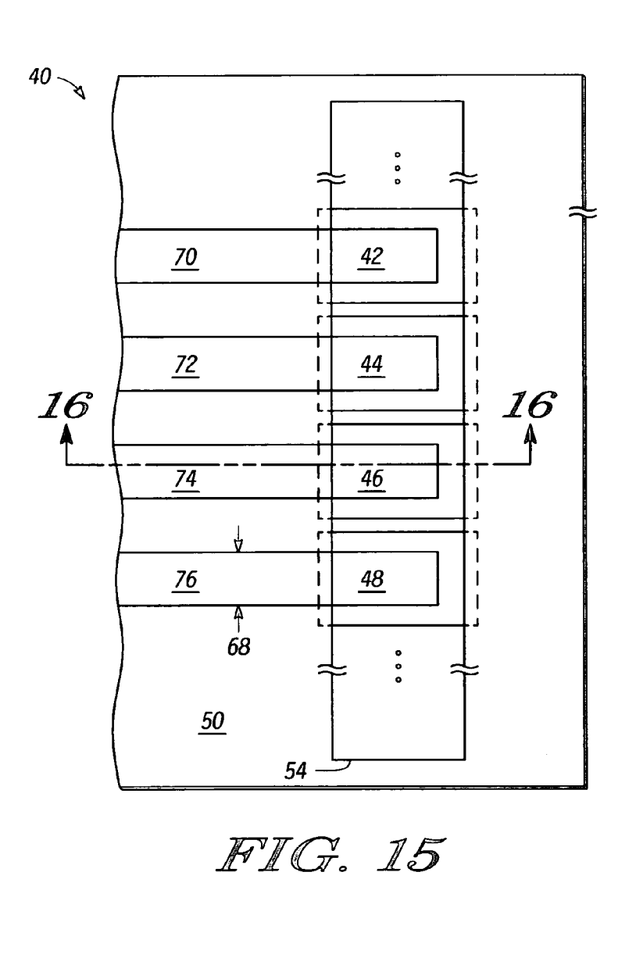

Illustrated in FIG. 15 is further processing of integrated circuit 40 in which a remainder of photoresist 58 and seed layer 56 has been removed. This removal step removes the seed layer 56 between the metal traces 70, 72, 74 and 76, isolates the traces and forms individual trace contacts to their respective die pads. In one form a remainder of photoresist 58 is stripped using a chemical stripping process and a remainder of seed layer 56 is etched away.

Figure 16:
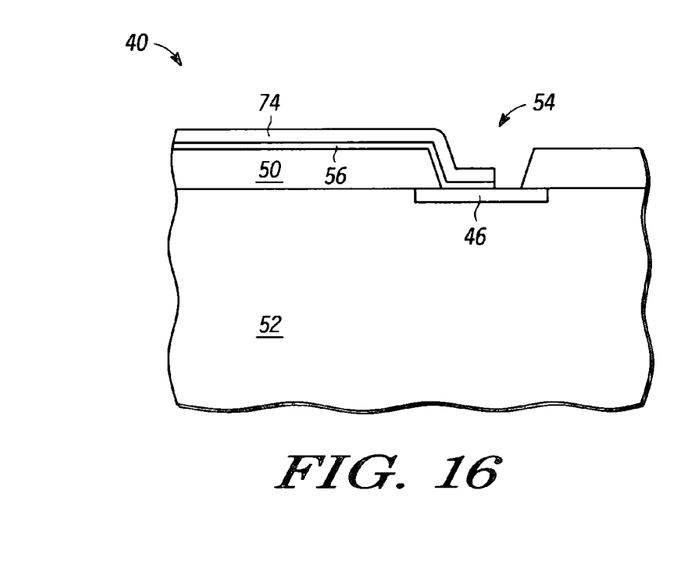

Illustrated in FIG. 16 is a cross-section of integrated circuit 40 taken substantially along line 16-16 of FIG. 15. In the illustrated form the opening 54 illustrates metal trace 74 making electrical contact to a predetermined portion of the die pad 46. In the illustrated form only a substantially left-side portion of the die pad 46 where the photoresist 58 previously was is now exposed. In an alternate form the whole of die pad 46 is exposed to permit continuation of a conductor into and from opposite sides of the die pad 46.

Figure 17:
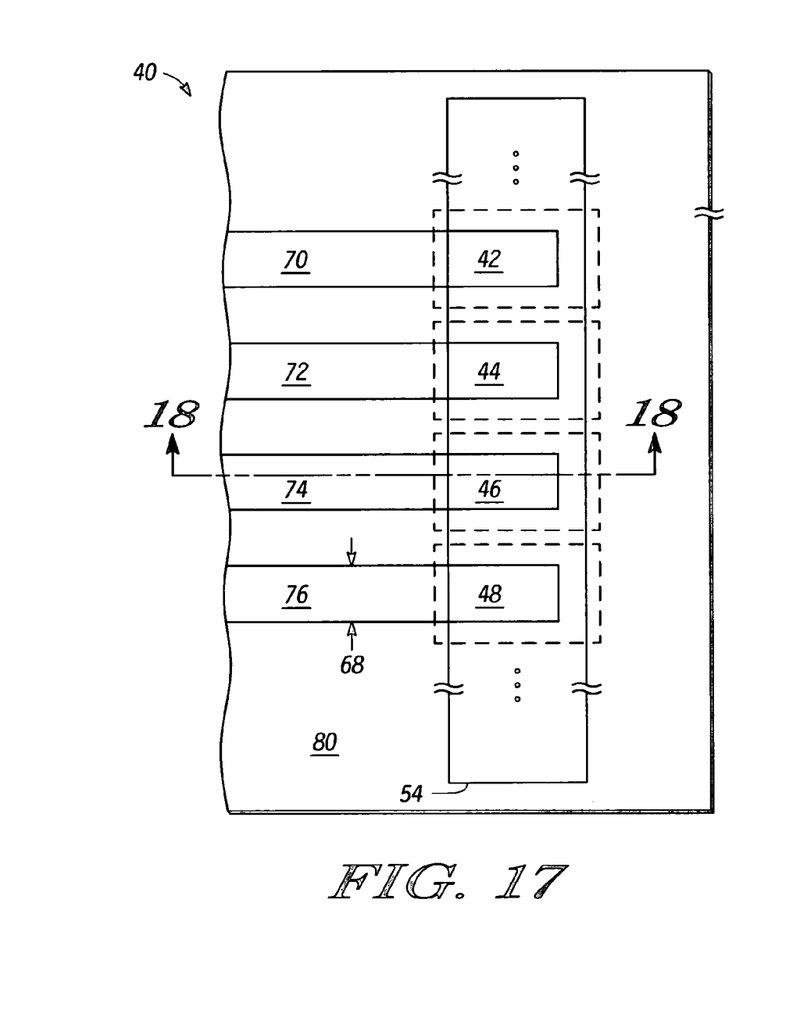

Illustrated in FIG. 17 is further processing of integrated circuit 40 in which a dielectric layer 80 is formed overlying and in contact with all metal traces 70, 72, 74 and 76, the exposed portion of die pads 42, 44, 46 and 48, and a portion of the dielectric layer 50. Dielectric layer 80 functions further to insulate the metal traces 70, 72, 74 and 76. It should be understood that at this point in the processing method additional circuit layers (not shown) may be added to implement a desired circuit function. Note that the pitch between any two of the metal traces 70, 72, 74 and 76 is the distance from the center of conductive trace to the center of an adjacent conductive trace. Thus, the pitch between any two of the metal traces 70, 72, 74 and 76 is equal to a separation distance between two adjacent conductive traces plus the width of one conductive trace, assuming that each of the conductive traces have substantially the same width. The pitch in the illustrated structure between any of metal traces 70, 72, 74 and 76 is substantially smaller than the pitch between metal interconnects 16 and 18 of FIG. 1.

Figure 18:
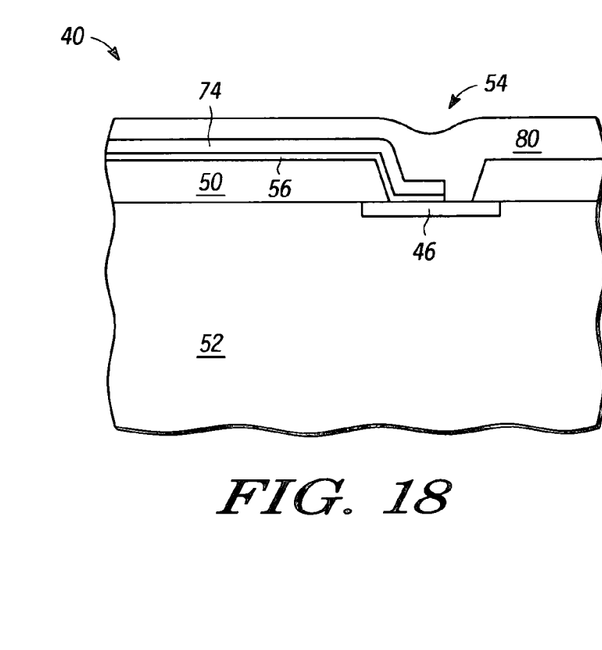

Illustrated in FIG. 18 is a cross-sectional view of integrated circuit structure 40 taken along line 18-18 of FIG. 17. In FIG. 18 dielectric layer 80 overlies and is in contact with the metal trace 74, the exposed portion of die pad 46 and a portion of the dielectric layer 50. As can be readily seen the dielectric layer 80 may be slightly recessed within the opening 54. Conventional planarization techniques may be used to further planarize the exposed surface of dielectric layer 80.

In one form the pitch of the structures illustrated in FIGS. 3-18 is one-third of the pitch of the integrated circuit of FIG. 1. This is a significant savings in die space that enables substantially more miniaturization of circuitry. By using a trench style via in which there is no pad in the upper one-half of the via, a significant reduction in pitch between two contact pads is accomplished.

By now it should be appreciated that there has been provided a semiconductor interconnect and method of making a semiconductor interconnect. A continuous trench is formed in a first direction across two or more pads. In a second direction, for each pad a conductive strip or metal trace is formed which is continuous and transitions from a level elevated above the pad (i.e. out of the plane of the pad) to a lower level to make contact with the pad. This structure may also be used in inverted (i.e. rotated upside down) form if desired. It should be noted that the portion of a conductive line overlying a dielectric opening does not need to cover the entire periphery or area of the opening.

The method taught herein is very helpful in manufacturing an interconnect to a semiconductor device. For example when an interconnect structure is being attached to a semiconductor die, there may be die drift associated with the alignment by the tool used to form the conductive traces to the pads of the die. Because the width of the metal traces 70, 72, 74 and 76 is less than the width of the die pads to which they are connected, die drift errors are automatically compensated as long as the die drift does not exceed a maximum drift value. There has herein been disclosed an interconnect structure that does not require a via (i.e. an opening in a dielectric that exposes an underlying pad to be contacted) to have an overlying or via capture pad. The conductive traces on a top surface of a dielectric layer are patterned to fall out of the plane in which the conductive traces are placed and into the opening without using a cover pad. The conductive trace interconnect may be placed either along a periphery or edge of an integrated circuit or anywhere else within the integrated circuit.

In the foregoing specification, the invention has been described with reference to specific embodiments. However, one of ordinary skill in the art appreciates that various modifications and changes can be made without departing from the scope of the present invention as set forth in the claims below. For example, while the metal traces 70, 72, 74 and 76 are illustrated as being perpendicular in direction to the trench or opening 54, the metal traces may be formed at other angles to the opening 54. While metal traces 70, 72, 74 and 76 are described as being formed by a conventional plating process, other known processes may be used to form conductive traces. The die pad 46 may be implemented as a conductive pad in other applications. For example a pad on an integrated circuit board or other type of substrate may be used. Various types of metals and metal alloys may be used. It should also be understood that various conductive materials, such as conductive epoxy, may be used. Accordingly, the specification and figures are to be regarded in an illustrative rather than a restrictive sense, and all such modifications are intended to be included within the scope of present invention.

In one form there is herein provided a method for contacting contact pads of an integrated circuit. A dielectric layer is provided over the integrated circuit and the contact pads. An opening in the dielectric layer is formed to expose the contact pads whereby a portion of the dielectric layer is removed between adjacent contact pads. A seed layer is formed over the dielectric layer and the contact pads after forming the opening. A photoresist layer is formed over the seed layer. The photoresist layer is patterned to form openings in a remaining portion of the photoresist layer to the contact pads. The openings form lines with widths and the remaining portion of the photoresist layer masks a first portion of the seed layer. The remaining portion of the photoresist is removed and the first portion of the seed layer is removed.

In one form the patterning of the photoresist layer exposes the seed layer in the openings and covers a first portion of the seed layer with a remaining portion of the photoresist layer. The remaining portion of the photoresist layer is removed and the first portion of the seed layer is removed. In one form the contact pads have a pitch that is no greater than 70 micrometers.

In one form the contact pads are along a periphery of the integrated circuit and the seed layer contains at least one of titanium, tungsten or copper. In another form all three of these metals are used in the seed layer.

In one form the minimum widths for the lines occurs over the contact pads. In another form the remaining portion of the photoresist layer covers a portion of the contact pads. In another form the contact pads have two edges aligned along two lines parallel to an adjacent periphery of the integrated circuit, and the opening in the dielectric layer has a length along a periphery of the integrated circuit and a width that is within the two lines.

In another form there is provided an interconnect structure over an integrated circuit structure, wherein the integrated circuit structure has a plurality of contact pads. A plurality of lines run over the integrated circuit structure and have trace portions in a region adjacent to the contact pads and contact portions over the contact pads. The contact portions make electrical contact to the contact pads. The trace portions are over a dielectric layer and the contact pads are in a single opening in the dielectric layer. In one form the contact pads are adjacent and have a pitch that is not greater than 70 micrometers. In one form the trace portions have a width and the contact portions have a width not exceeding a minimum of the width of the trace portions. The contact pads have two edges aligned along two lines parallel to an adjacent periphery of the integrated circuit, wherein the opening in the dielectric layer has a length along a periphery of the integrated circuit and a width that is within the two lines.

In another form there is provided a method of forming a first conductive line to a first contact pad. The first contact pad is over a portion of a first dielectric layer. A seed layer is formed over the first dielectric layer and the first contact pad. A photoresist layer is formed over the first dielectric layer. The photoresist layer is patterned to form a first opening in the photoresist layer and leave a remaining portion of the photoresist layer. The opening has a first trace portion in a region adjacent to the first contact pad and a first contact portion over the first contact pad. The first contact portion makes electrical contact to the first contact pad. The first trace portion has a width and the first contact portion has a width not substantially exceeding a minimum of the width of the first trace portion. Conductive material is formed in the first opening to make electrical contact to the first contact pad in the first contact portion and form a first conductive trace in the first trace portion, whereby the first conductive line is formed. In another form a second dielectric layer is formed over the first dielectric layer. An opening in the second dielectric layer is formed wherein the first contact pad is in the opening in the second dielectric layer. The first trace portion is over the second dielectric layer.

In another form the photoresist layer is patterned to expose the seed layer in the opening and cover a first portion of the seed layer with the remaining portion of the photoresist layer. The remaining portion of the photoresist layer is removed and the first portion of the seed layer is removed. In one form the seed layer is at least one of titanium, tungsten or copper. In another form a second conductive line makes contact to a second contact pad, wherein the second contact pad is over a second portion of the first dielectric layer. The seed layer is formed over the second contact pad. The photoresist layer is patterned to form a second opening in the photoresist layer. The second opening has a second trace portion in a region adjacent to the second contact pad and a second contact portion over the second contact pad. The second contact portion makes electrical contact to the second contact pad. The second trace portion has a width and the second contact portion has a width not substantially exceeding a minimum of the width of the second trace portion. In one form conductive material is formed in the second opening to make electrical contact to the second contact pad in the second contact portion and a second conductive trace is formed in the second trace portion whereby the second conductive line is formed. In another form the first and second contact pads are separated at a pitch that is no greater than 70 micrometers. In yet another form a second dielectric layer is formed over the first dielectric layer. An opening in the second dielectric layer is formed wherein the first contact pad and the second contact pad are in the opening in the second dielectric layer. A region is directly between the first contact pad and the second pad. The first trace portion and the second trace portion are over the second dielectric layer, and the opening in the second dielectric layer includes the region directly between the first and second contact pads.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "plurality", as used herein, is defined as two or more than two. The term "another", as used herein, is defined as at least a second or more. The terms "including" and/or "having", as used herein, are defined as "comprising" (i.e., open language). The term "coupled", as used herein, is defined as connected, although not necessarily directly, and not necessarily mechanically.

What is claimed is:

1. A method for contacting contact pads of an integrated circuit, comprising:
   providing a dielectric layer over the integrated circuit and the contact pads;
   forming an opening in the dielectric layer to create an open area in the dielectric layer and expose the contact pads whereby a portion of the dielectric layer is removed between adjacent contact pads;
   forming a seed layer over the dielectric layer and the contact pads after forming the opening;
   forming a photoresist layer over the seed layer;
   patterning the photoresist layer to form trace openings in the photoresist layer to the contact pads, wherein the trace openings in the photoresist layer form lines with widths, wherein a remainder of the photoresist layer masks a first portion of the seed layer and minimum widths of the lines occur over the contact pads;
   forming metal in the trace openings in the photoresist layer to make electrical contact to the contact pads, the metal not covering all of the open area in the dielectric layer;
   removing the remainder of the photoresist layer; and
   removing the first portion of the seed layer.

2. The method of claim 1 wherein the step of patterning the photoresist layer exposes the seed layer in the trace openings in the photoresist layer and covers the first portion of the seed layer with the remainder of the photoresist layer.

3. The method of claim 1, wherein the contact pads have a pitch that is no greater than 70 micrometers.

4. The method of claim 1, wherein the contact pads are along a periphery of the integrated circuit open area in the dielectric layer.

5. The method of claim 1, wherein the seed layer comprises at least one of titanium, tungsten or copper.

6. The method of claim 1, wherein the remainder of the photoresist layer covers a portion of the contact pads.

7. The method of claim 1, wherein the contact pads have two edges aligned along two lines parallel to an adjacent periphery of the integrated circuit, wherein the opening in the dielectric layer has a length along a periphery of the integrated circuit and a width that is within the two lines.

8. A method of forming a first conductive line to a contact pad, comprising:
   forming the contact pad within a first layer and exposed at a surface of the first layer;
   forming a dielectric layer overlying the first layer and the contact pad;
   forming a first opening in the dielectric layer to expose a portion of the contact pad and the first layer, the first opening being larger than a width of the contact pad;
   forming a seed layer over the dielectric layer, the first layer and the contact pad;
   forming a photoresist layer over the seed layer;
   patterning the photoresist layer to form a first opening in the photoresist layer and leave a remaining portion of the photoresist layer, wherein:
      the first opening in the photoresist layer has a first trace portion in a region adjacent to the contact pad, and the first opening has a first contact portion over the first contact pad,
      the first contact portion makes electrical contact to the contact pad;
      the first trace portion has a width that is less than the first opening in the photoresist layer; and
      the first contact portion has a width not substantially exceeding a minimum of the width of the first trace portion; and
   forming conductive material in a portion less than all of the first opening in the photoresist layer to make electrical contact to the first contact pad in the first contact portion and to form a first conductive trace in the first trace portion, whereby the first conductive line is formed.

9. The method of claim 8, further comprising:
   forming the opening in the dielectric layer as a continuous opening that also exposes a second contact pad laterally adjacent the contact pad; and
   forming a second opening in the photoresist layer to form a second trace portion that make electrical contact to the second contact pad, wherein no widening of the first trace portion is required where the first trace portion makes electrical contact to the contact pad and no widening of the second trace portion is required where the second trace portion makes electrical contact to the second contact pad.

10. The method of claim 8 wherein the step of patterning the photoresist layer exposes the seed layer in the first opening of the photoresist layer and covers a first portion of the seed layer with the remaining portion of the photoresist layer, further comprising:

removing the remaining portion of the photoresist layer; and removing the first portion of the seed layer.

11. The method of claim 8, wherein the seed layer comprises titanium, tungsten, and copper.

12. The method of claim 8, wherein the first trace portion is positioned perpendicular to a side of the first opening in the dielectric layer.

13. The method of claim 12, wherein the first and second contact pads are separated at a pitch that is no greater than 70 micrometers.

14. The method of claim 8, further comprising:

forming a second dielectric layer overlying the contact pad and the first conductive trace.

15. The method of claim 12, wherein the first and second contact pads are along a periphery of an integrated circuit.

16. In an integrated circuit, a method for contacting contact pads, comprising:

providing the contact pads in a common opening of a dielectric layer; and forming conductive traces to each of the contact pads in the common opening, comprising:

routing a trace portion of each of a plurality of conductive lines in a region adjacent to the contact pads and over the dielectric layer; and routing a contact portion of each of the plurality of conductive lines over a respective one of the contact pads to make electrical contact by each of the plurality of conductive lines to a respective differing one of the contact pads, the contact portion of each of the conductive lines being no wider than its respective trace portion, wherein conductive material used to form the trace portion and the contact portion of the conductive lines does not cover all of the common opening of the dielectric layer.

17. The method of claim 16 further comprising forming the contact pads adjacent to each other and having a pitch that is not greater than 70 micrometers.

18. The method of claim 16 further comprising:

aligning two edges of each of the contact pads along two lines parallel to an adjacent periphery of the integrated circuit; and forming the common opening in the dielectric layer with a length that is substantially along a periphery of the integrated circuit and with a width that is within the two lines.

* * * * *